(12) United States Patent  
Costello

(10) Patent No.: US 9,431,783 B1  
(45) Date of Patent: Aug. 30, 2016

(54) ELECTRONIC SYSTEM WITH POWER BUS BAR

(71) Applicant: Tyco Electronics Corporation, Berwyn, PA (US)

(72) Inventor: Brian Patrick Costello, Scotts Valley, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 14/665,466

(22) Filed: Mar. 23, 2015

(51) Int. Cl.  
*H01R 12/58* (2011.01)  
*H01R 27/02* (2006.01)

(52) U.S. Cl.  
CPC .................................. *H01R 27/02* (2013.01)

(58) Field of Classification Search  
CPC .. H05K 7/1457; H01R 12/58; H01R 12/585; H01R 12/73; H01R 12/91  
See application file for complete search history.

(56) References Cited

U.S. PATENT DOCUMENTS

| | | | | | |
|---|---|---|---|---|---|
| 4,721,470 | A | * | 1/1988 | Humphrey | H01R 13/6453 439/55 |
| 4,862,326 | A | * | 8/1989 | Blomstedt | H05K 7/1457 361/622 |
| 5,105,340 | A | * | 4/1992 | Lawrence | G06F 13/409 174/255 |
| 6,036,508 | A | * | 3/2000 | Anderson | H01R 12/721 439/80 |
| 6,498,716 | B1 | * | 12/2002 | Salinas | G06F 1/189 307/150 |
| 6,762,362 | B1 | * | 7/2004 | Cavanaugh | H05K 7/1457 174/149 B |
| 8,795,001 | B1 | * | 8/2014 | Lam | H01R 12/7088 439/636 |
| 9,072,191 | B2 | * | 6/2015 | Silberbauer | H05K 7/1432 |
| 2008/0293277 | A1 | * | 11/2008 | Kumar | H01R 13/53 439/247 |
| 2010/0035470 | A1 | * | 2/2010 | Liu | H01R 12/585 439/607.08 |
| 2014/0120760 | A1 | * | 5/2014 | Zieman | H01R 12/91 439/357 |
| 2015/0194751 | A1 | * | 7/2015 | Herring | H01R 12/716 439/78 |

* cited by examiner

*Primary Examiner* — Gary Paumen

(57) ABSTRACT

A system includes a backplane and an auxiliary connector mounted to the backplane. The auxiliary connector is configured to mate with a corresponding mating auxiliary connector of an electrical power supply. A power connector is mounted directly to the backplane. The power connector is configured to mate with a corresponding mating power connector of the electrical power supply. A power bus bar is mounted to the backplane. The power bus bar is engaged in electrical contact with the power connector.

20 Claims, 11 Drawing Sheets

ELECTRONIC SYSTEM WITH POWER BUS BAR

BACKGROUND OF THE INVENTION

The subject matter described and/or illustrated herein relates generally to power supplies for supplying electrical power to electrical systems.

Power supplies that supply electrical power to electronic systems are being designed to have greater power capacity (e.g., supply more electrical wattage) to accommodate the increased electrical power consumption of contemporary electronic systems. In some circumstances, it is also desirable to decrease the size of the power supply. As the power capacity of power supplies has increased, power bus bars have been incorporated into the electronic system to handle the larger current load supplied by the power supply. But, it may be difficult or impossible to mate the power supply to an electronic system that includes a power bus bar. For example, some known power supplies include connectors that are fixed in position, for example on a printed circuit board of the power supply. The electrical power connector(s) of the power supply mate directly with the bus bar to provide the electrical power connection(s) between the power supply and the electronic system. But, if there are one or more other connections between the power supply and the electronic system (e.g., one or more signal connections), the dimensional tolerances between the backplane of the electronic system and the power bus bar may be too large to enable the fixed connectors of the power supply to mate with the electronic system. In other words, one or more of the fixed connectors of the power supply may not align with the corresponding connector of the electronic system such that the power supply cannot mate with the electronic system.

At least some known power supplies and/or electronic systems include one or more floating connectors that float along one or more axes (e.g., up and down and/or side to side). Floating enables the connectors of the power supply to align with the corresponding connectors of the electronic system such that the power supply can mate with the electronic system over a tolerance range. But, floating connectors may be larger than desired and/or may be expensive. For example, floating connectors may occupy a relatively significant amount of space on the power supply and/or at the interface between the power supply and the electronic system. Floating connectors may be more complex and/or require a greater number of components than fixed connectors and may therefore be costly, for example.

BRIEF DESCRIPTION OF THE INVENTION

In an embodiment, a system includes a backplane and an auxiliary connector mounted to the backplane. The auxiliary connector is configured to mate with a corresponding mating auxiliary connector of an electrical power supply. A power connector is mounted directly to the backplane. The power connector is configured to mate with a corresponding mating power connector of the electrical power supply. A power bus bar is mounted to the backplane. The power bus bar is engaged in electrical contact with the power connector.

In an embodiment, a system includes a backplane and an auxiliary connector mounted to the backplane. The auxiliary connector is configured to mate with a corresponding mating auxiliary connector of an electrical power supply. A power bus bar mounted to the backplane. A power connector is mounted to the backplane. The power connector is configured to mate with a corresponding mating power connector of the electrical power supply. The power connector is a discrete component from the power bus bar that is engaged in electrical contact with the power bus bar.

In an embodiment, a system includes a backplane and an auxiliary connector mounted to the backplane. The auxiliary connector is configured to mate with a corresponding mating auxiliary connector of an electrical power supply. A power connector is mounted to the backplane. The power connector is configured to mate with a corresponding mating power connector of the electrical power supply. A power bus bar is mounted to the backplane. The power bus bar is engaged in electrical contact with the power connector. The power bus bar is configured to float along at least one axis relative to the backplane during mounting of the power bus bar to the backplane.

DETAILED DESCRIPTION OF THE INVENTION

Figure 1:
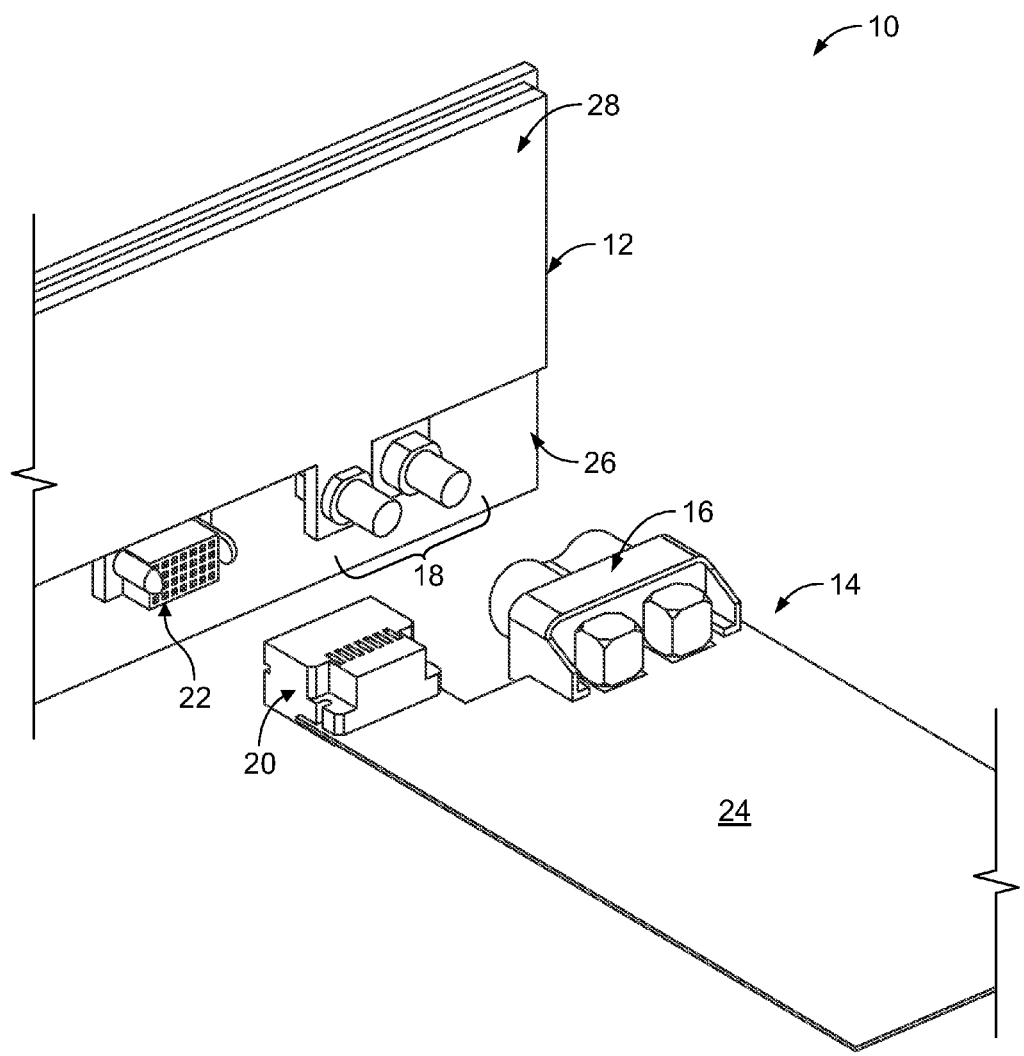
FIG. 1 is a partially exploded perspective view of a portion of an embodiment of an assembly of an electronic system and an associated electrical power supply.

FIG. 1 is a perspective view of a portion of an embodiment of an assembly 10 of an electronic system 12 and an associated electrical power supply 14. The power supply 14 is configured to be mated with the electronic system 12 to supply the electronic system 12 with electrical power to drive operation of the electronic system 12. FIG. 1 illustrates the electronic system 12 and the power supply 14 in an unmated condition. The power supply 14 includes one or more power connectors 16 that are configured to mate with corresponding power connectors 18 of the electronic system 12 for supplying the electronic system 12 with electrical power. The power supply 14 may also provide a signal connection to the electronic system 12 for transmitting signals between the electronic system 12 and another component (not shown). Accordingly, the illustrated embodiment of the power supply 14 also includes one or more signal connectors 20 that are configured to mate with corresponding signal connectors 22 of the electronic system 12 for transmitting signals between the electronic system 12 and the other component.

The power supply 14 may be any type of electrical power supply having any components, structure, and/or the like. In the illustrated embodiment, the power supply 14 includes a printed circuit board 24. The power connectors 16 and the signal connectors 20 of the power supply 14 are fixed in position on the circuit board 24 in the illustrated embodiment. In addition or alternatively to the printed circuit board 24, the power supply 14 may include one or more electrical wires (not shown) and/or other components (not shown). The power supply 14 may include any number of the power connectors 16 and any number of the signal connectors 20. As should be apparent from FIGS. 2, 4, and 5, the power supply 14 may include two power connectors 16 and two signal connectors 20. Each power connector 16 may be referred to herein as a "mating power connector". Each signal connector 20 may be referred to herein as a "mating auxiliary connector".

Figure 2:
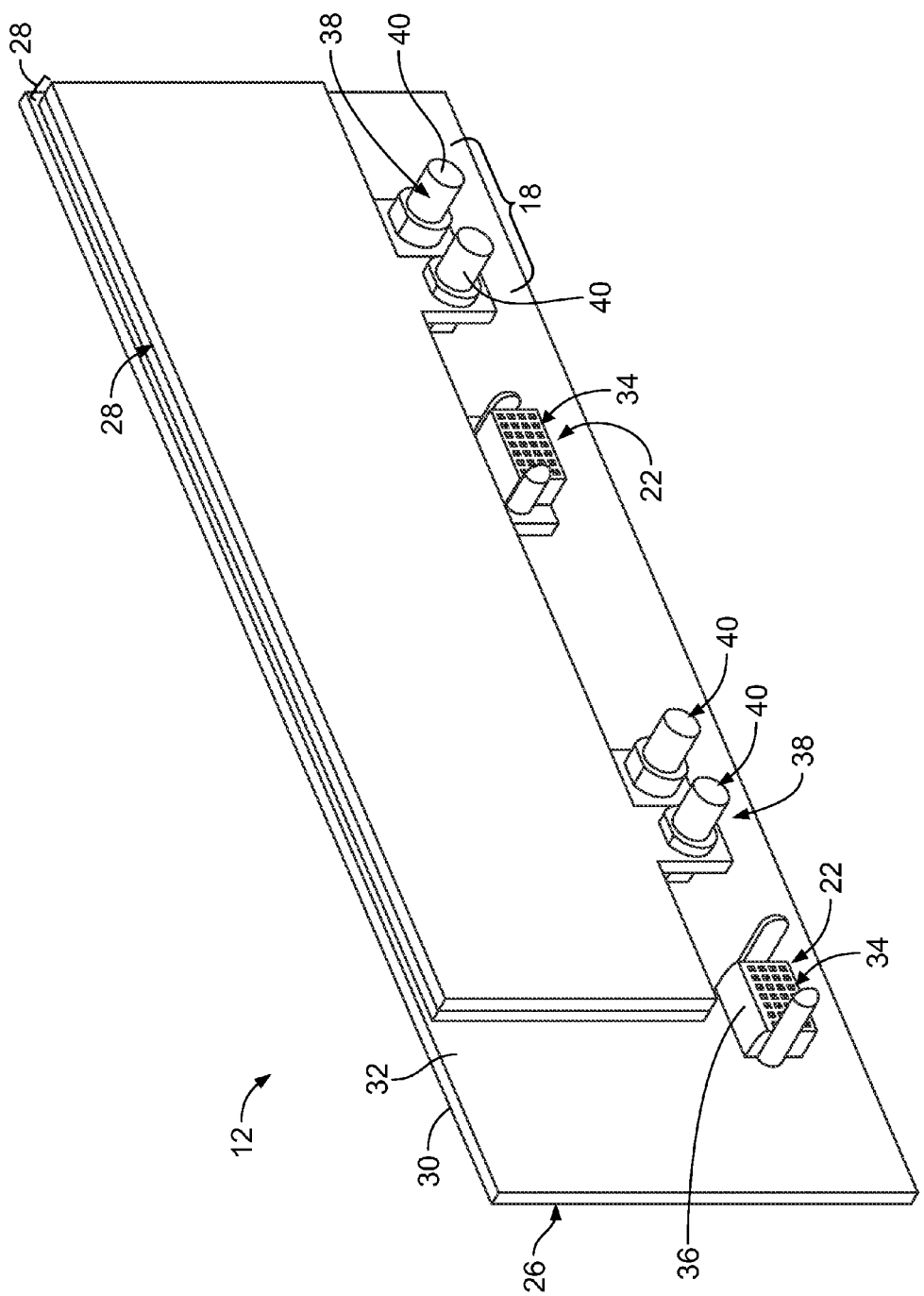
FIG. 2 is a perspective view of an embodiment of the electronic system shown in FIG. 1.
Figure 4:
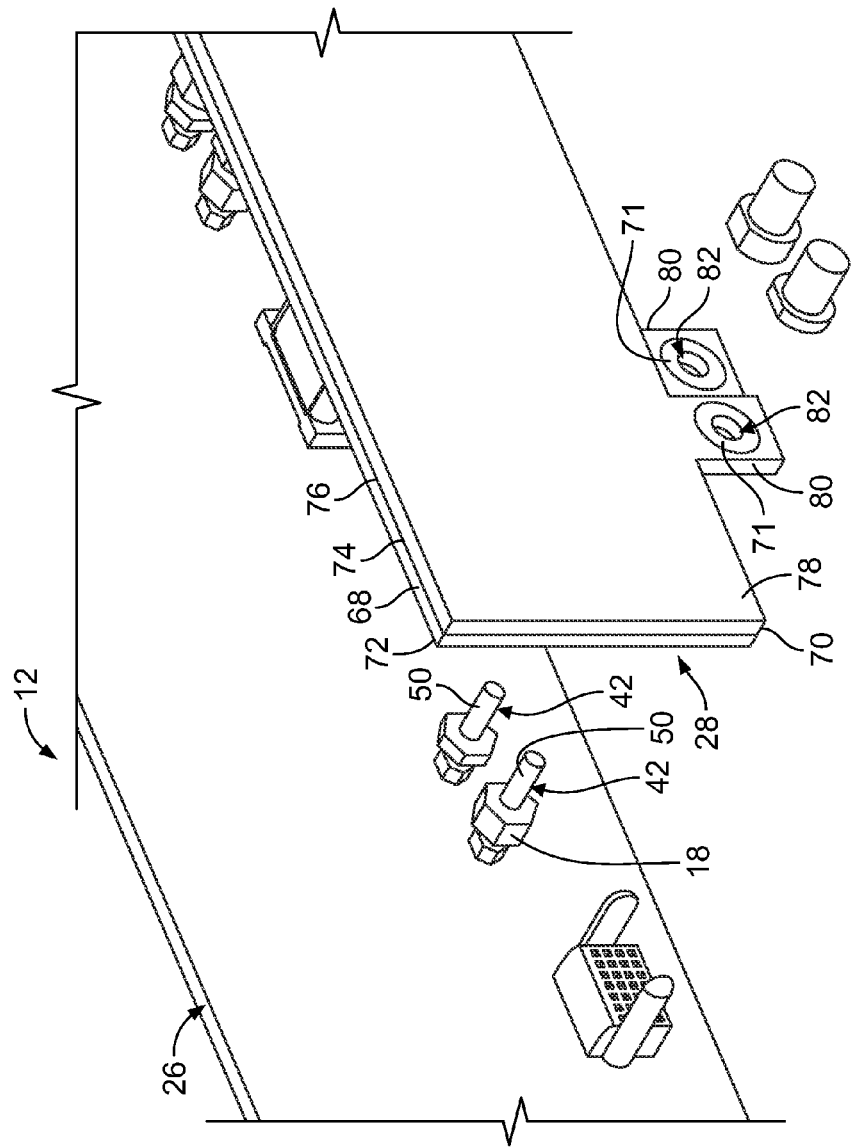
FIG. 4 is a partially exploded perspective view of the electronic system shown in FIGS. 1 and 2.

As will be described below with reference to FIG. 2, the electronic system 12 includes a backplane 26, a power bus bar assembly 28, one or more of the power connectors 18, and one or more of the signal connectors 22. The electronic system 12 also includes other components that are not shown herein for clarity. Such other components of the electronic system 12 that are not shown herein may include, but are not limited to, processing components, storage components, display components, and/or the like. The electronic system 12 may be any type of electronic system that includes a backplane. The electronic system 12 may include any number of the power connectors 18 and any number of the signal connectors 22. As shown in FIGS. 2 and 4, the illustrated embodiment of the electronic system 12 includes two power connectors 18 and two signal connectors 22. In some embodiments, one or more of the signal connectors 22 and the corresponding signal connector 20 may supply electrical power to the electronic system 12 (e.g., an electrical power input to the power supply 14) in addition to the signal connection provided by the corresponding signal connectors 20 and 22. Moreover, in some embodiments, the electronic system 12 does not include any signal connectors 22 and/or the electronic system 12 includes one or more power connectors (not shown; each of which may be referred to herein as an "auxiliary connector") that mate with corresponding power connectors (not shown; each of which may be referred to herein as a "mating auxiliary connector") of the power supply 14 to provide an electrical power input to the power supply 14 (i.e., supply electrical power to the power supply 14). Each signal connector 22 may be referred to herein as an "auxiliary connector".

FIG. 2 is a perspective view of an embodiment of the electronic system 12. As described above, the electronic system 12 includes the backplane 26, which includes opposite faces 30 and 32. The signal connectors 22 are mounted to the backplane 26 such that mating interfaces 34 of the signal connectors 22 are exposed along the direction of the face 32 for mating with the signal connectors 20 (shown in FIGS. 1 and 6) of the power supply 14 (shown in FIGS. 1 and 6). In the illustrated embodiment, the signal connectors 22 are plug connectors that include plugs 36 that are received by the corresponding signal connectors 20. But, each signal connector 22 additionally or alternatively may include any other structure (i.e., each signal connector 22 may be any type of connector).

The power connectors 18 are mounted to the backplane 26 such that mating interfaces 38 of the power connectors 18 are exposed along the face 32 of the backplane 26 for mating with the power connectors 16 (shown in FIGS. 1 and 6) of the power supply 14. In the illustrated embodiment of the power connectors 18, the mating interface 38 of each power connector 18 is defined by power pins 40 that mate with the corresponding power connector 16 of the power supply 14 for transferring electrical power from the power supply 14 to the electronic system 12. But, the mating interface 38 of each power connector 18 additionally or alternatively may include any other structure (e.g., the power blades 140 shown in FIGS. 7-10). Although two are shown, each power connector 18 may include any number of electrical connections with the corresponding power connector 16 of the power supply 14.

The bus bar assembly 28 is mounted to the backplane 26 along the direction of the face 32 of the backplane 26 such that the bus bar assembly 28 is engaged in electrical contact with the power connectors 18, as will be described below. The bus bar assembly 28 and the power connectors 18 thus are electrically connected to each other. The bus bar assembly 28 may facilitate handling a larger current load supplied to the electronic system 12 from the power supply 14 as compared to systems that do not include a bus bar assembly 28. In the illustrated embodiment, the bus bar assembly 28 is mounted to the power connectors 18 such that the bus bar assembly 28 is indirectly mounted to the backplane 26 (i.e., the bus bar assembly 28 is mounted to the backplane 26 via the power connectors 18), as will be described below. The bus bar assembly 28 will be described below with reference to FIGS. 4 and 5.

Figure 3:
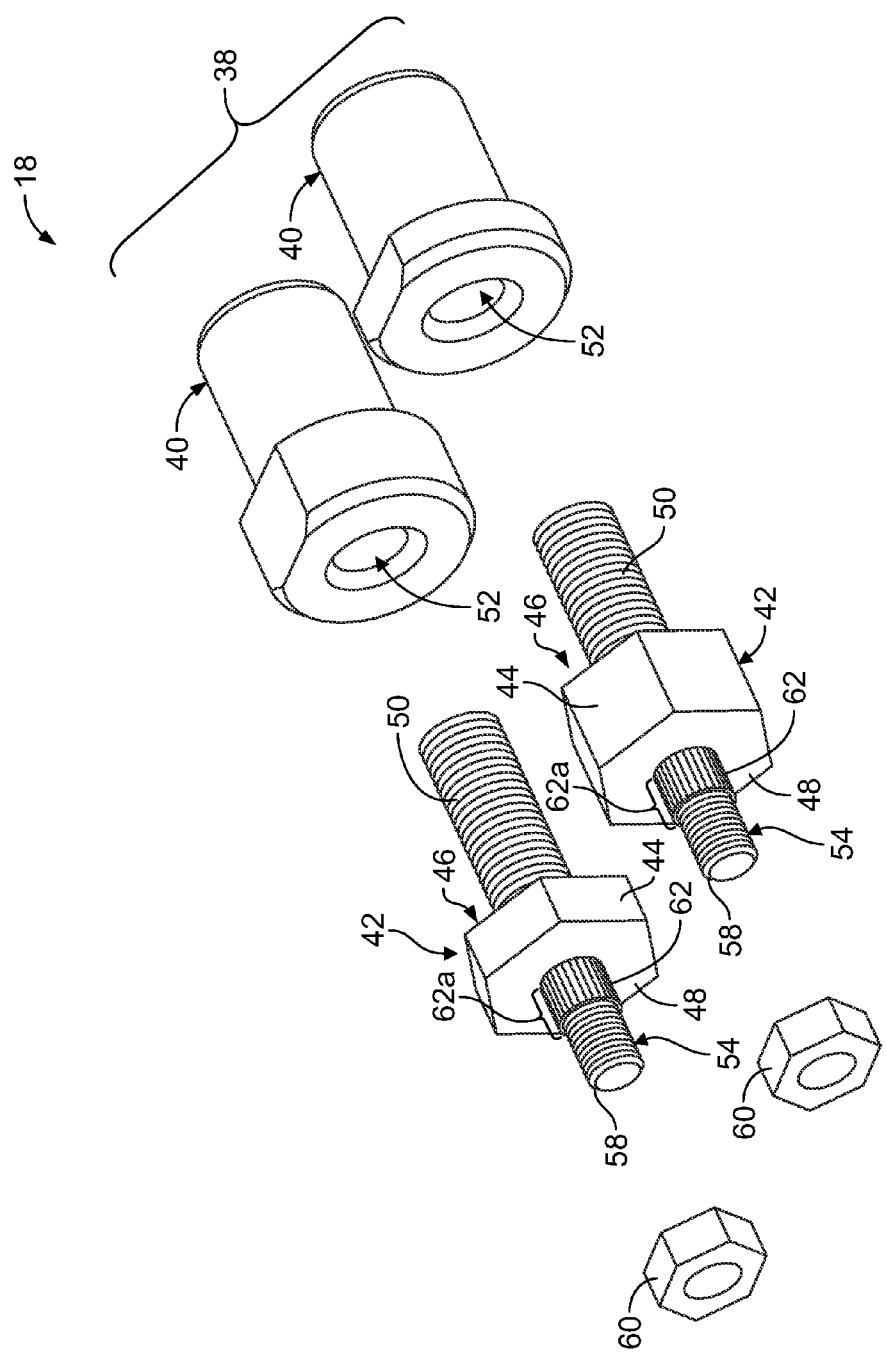
FIG. 3 is an exploded perspective view of an embodiment of a power connector of the electronic system shown in FIGS. 1 and 2.

FIG. 3 is an exploded perspective view of an embodiment of a power connector 18 of the electronic system 12. The illustrated embodiment of the power connector 18 includes two alignment pins 42 and two of the power pins 40. Each alignment pin 42 includes a flange 44 having opposite sides 46 and 48. A threaded shaft 50 extends outward from the side 46 of the flange 44 of each alignment pin 42. Each power pin 40 includes a threaded opening 52 that receives the threaded shaft 50 of the corresponding alignment pin 42 therein in threaded engagement. In other words, the power pins 40 are mounted to the alignment pins 42 by being threaded onto the threaded shaft 50 of the corresponding alignment pin 42. As described above, the power pins 40 define the mating interface 38 of the power connector 18. As will be described below, a portion of the bus bar assembly 28 (shown in FIGS. 1, 2, and 4-6) is received on the threaded shaft 50 and clamped between the power pin 40 and the flange 44 of each alignment pin 42 to mount the bus bar assembly 28 to the power connectors 18.

A backplane shaft 54 extends outward from the side 48 of the flange 44 of each alignment pin 42. The backplane shaft 54 is received within a corresponding hole 56 (shown in FIG. 6) of the backplane 26 (shown in FIGS. 1, 2, and 4-6) to mount the alignment pin 42 to the backplane 26, as will be described below. Each alignment pin 42, and thus the power connector 18, is thereby directly mounted to the backplane 26. In the illustrated embodiment, the backplane shafts 54 include threads 58 and nuts 60 are used to secure the alignment pins 42 to the backplane 26 in position within the corresponding hole 56. But, any other type of structure, fastener, and/or the like may be used in addition or alternatively to the threads 58 of the backplane shaft 54 and/or the nuts 60 to secure the alignment pins 42 to the backplane 26. For example, in some other embodiments, one or more of the alignment pins 42 is soldered in position within the corresponding hole 56. Each hole 56 may be referred to herein as a "backplane hole".

Each alignment pin 42 of the power connector 18 includes an alignment feature 62 that cooperates with the backplane 26 to locate the power connector 18 relative to the signal connectors 22 (shown in FIGS. 1, 2, 5, and 6) along the backplane 26. Specifically, the alignment feature 62 centers the alignment pin 42 relative to the corresponding hole 56 of the backplane 26. In the illustrated embodiment of the alignment pins 42, each backplane shaft 54 includes the alignment feature 62. More particularly, the illustrated embodiment of the alignment feature 62 is a knurled segment 62a of the backplane shaft 54 that extends between the threads 58 of the backplane shaft 54 and the flange 44 of the alignment pin 42. The knurled segment 62a engages an interior surface 64 (shown in FIG. 6) of the corresponding hole 56 to self-center the backplane shaft 54 within the corresponding hole 56. Although shown as being a straight knurl having knurl projections that extend approximately parallel with a central longitudinal axis 66 of the backplane shaft 54, the knurled segment 62a additionally or alternatively may include knurl projections that extend at a different angle relative to the central longitudinal axis 66. Moreover, another type of alignment feature (such as, but not limited to, differently shaped and/or oriented projections as compared to knurl projections and/or the like) may be used in addition or alternative to the knurled segment 62a to self-center the backplane shaft 54 within the corresponding hole 56.

Figure 5:
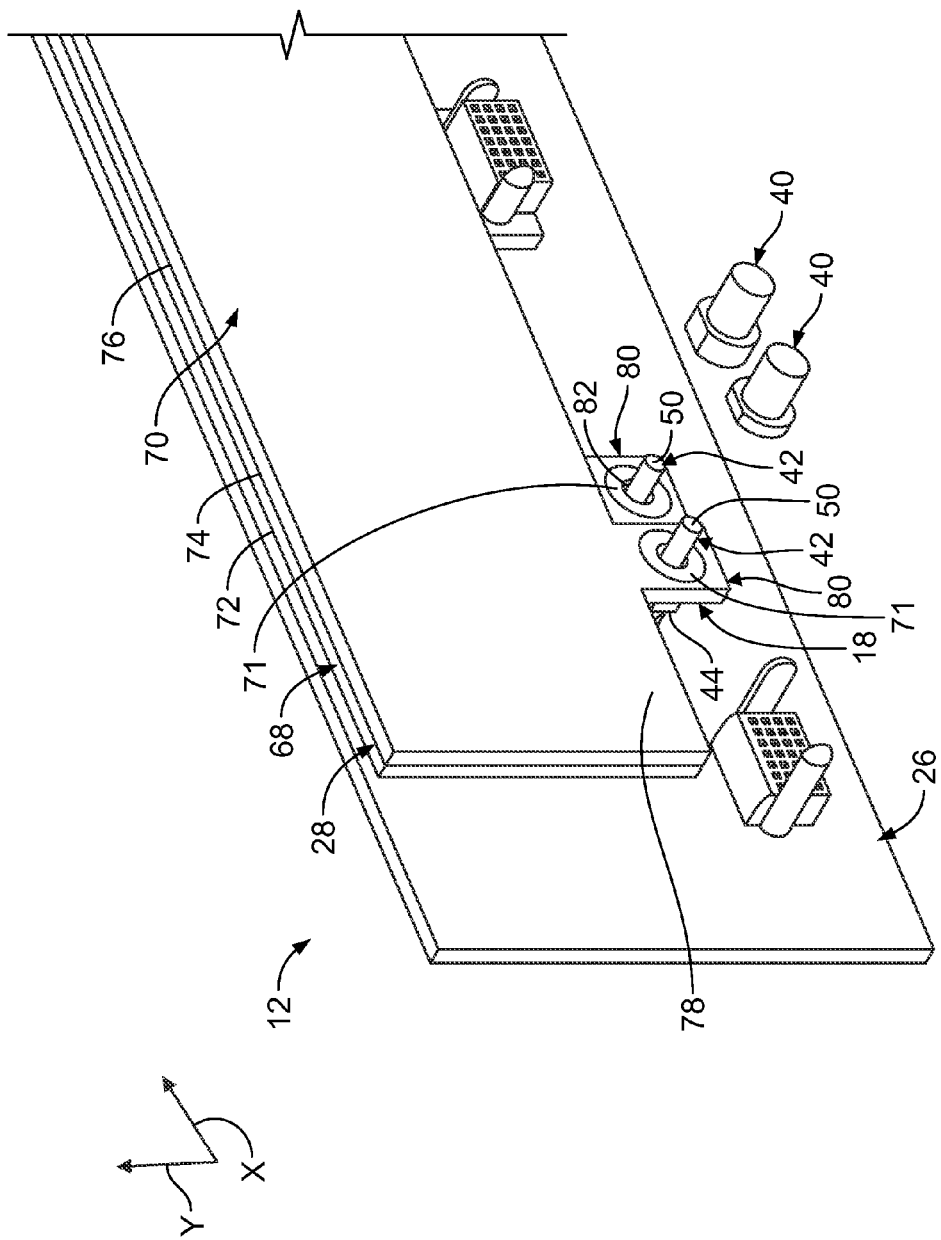
FIG. 5 is another partially exploded perspective view of the electronic system shown in FIGS. 1 and 2.

FIG. 4 is a partially exploded perspective view of the electronic system 12 illustrating the bus bar assembly 28 exploded from the backplane 26. FIG. 5 is a partially exploded perspective view of the electronic system 12 illustrating the bus bar assembly 28 assembled to the backplane 26. Referring now to FIGS. 4 and 5, in the illustrated embodiment, the bus bar assembly 28 includes two layers, namely an inner layer 68 and an outer layer 70. Each layer 68 and 70 is electrically conductive. The inner layer 68 includes opposite faces 72 and 74, and the outer layer 70 includes opposite faces 76 and 78. In the illustrated embodiment, the layers 68 and 70 are stacked against each other such that the faces 74 and 76 are engaged in physical contact with each other, with the face 72 of the inner layer 68 facing toward the backplane 26 and the face 78 of the outer layer 70 facing away from the backplane 26. Portions of the layers 68 and/or 70 (e.g., the face 72, the face 74, the face 76, the face 78, edge portion(s), and/or the like) may be covered (e.g., coated) with an electrically insulating material to electrically isolate the layers 68 and 70 from each other and/or to facilitate preventing electrical shorting and/or electrical shock. For example, in the illustrated embodiment, an approximate entirety (excepting the areas 71 described below) of each of the layers 68 and 70 is covered with an electrically insulating material. As shown in FIGS. 4 and 5, the areas 71 surrounding the mounting openings 82 described below are left uncovered on the faces 72 and/or 74 of the layer 68 and on the faces 76 and/or 78 of the layer 70 to enable the layers 68 and 70 to make electrical contact with the corresponding power pin 40 and/or the corresponding alignment pin 42. Although the illustrated embodiment of the bus bar assembly 28 includes two layers 68 and 70, the bus bar assembly 28 may include any number of layers. In some embodiments, the bus bar assembly 28 includes only a single layer. The bus bar assembly 28 may be referred to herein as a "power bus bar", regardless of the number of layers.

In the illustrated embodiment, each layer 68 and 70 includes a mounting flange 80 that is configured to mount the bus bar assembly 28 on a corresponding alignment pin 42 of a corresponding power connector 18. Each mounting flange 80 includes a mounting opening 82 that is configured to receive the threaded shaft 50 of the corresponding alignment pin 42 therethrough to mount the bus bar assembly 28 to the power connectors 18, and thus to the backplane 26. The mounting opening 82 is over-sized relative to the corresponding threaded shaft 50 to enable the bus bar assembly 28 to float relative to the threaded shaft 50 during mounting of the bus bar assembly 28 to the backplane 26, as will be described below.

Although each layer 68 and 70 includes a mounting flange 80 and mounting opening 82 for mounting to a different alignment pin 42 of the same power connector 18, in other embodiments one or more of the layers 68 and/or 70 includes two mounting flanges 80 and two mounting openings 82 for mounting to both alignment pins 42 of the same power connector 18. Moreover, in some embodiments, only one of the layers 68 or 70 includes the mounting flanges 80 and mounting openings 82.

Figure 6:
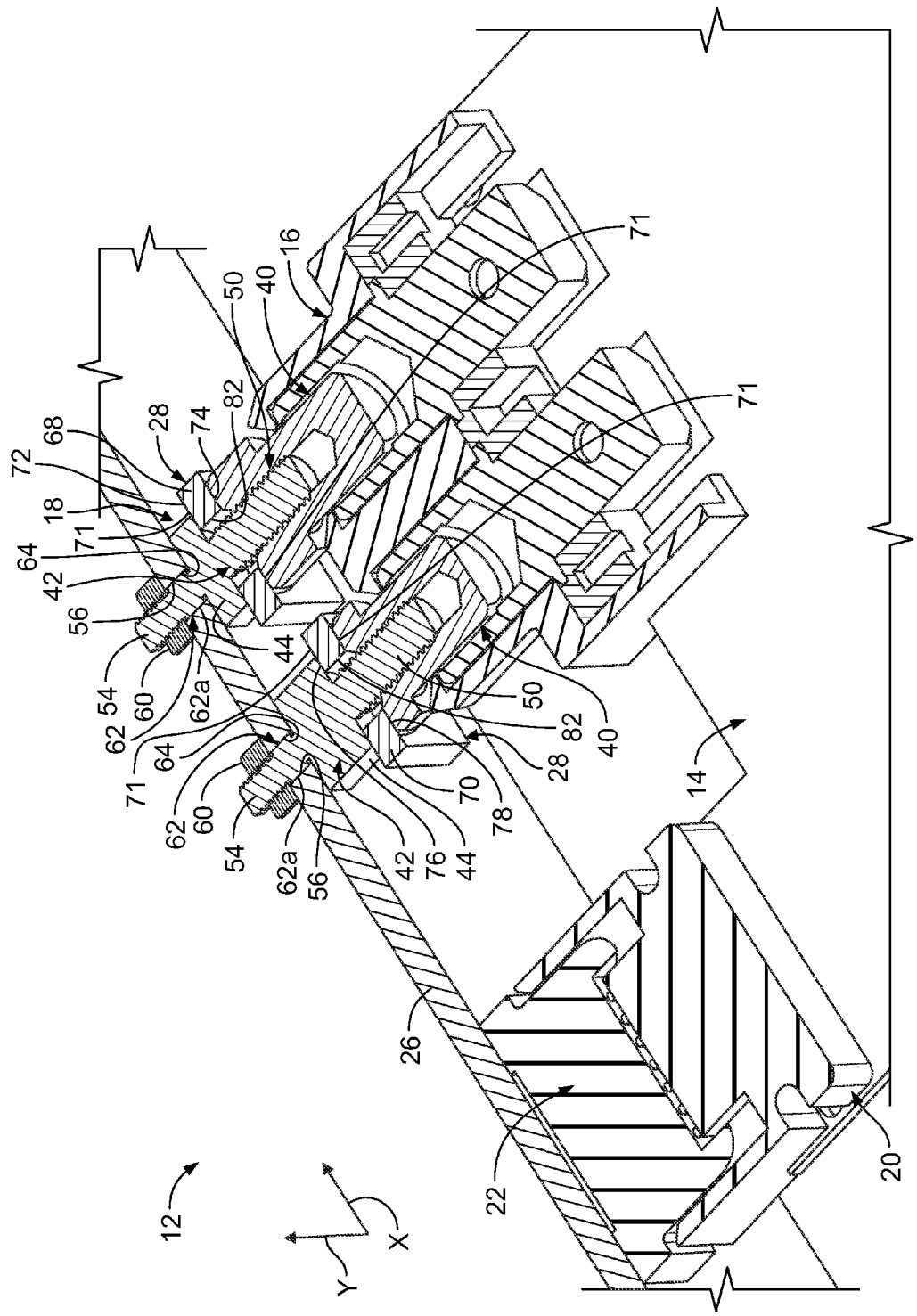
FIG. 6 is a cross-sectional view of a portion of the electronic system shown in FIGS. 1-5.

FIG. 6 is a cross-sectional view of a portion of the electronic system 12. The alignment pins 42 of the power connector 18 are shown as directly mounted to the backplane 26. Specifically, the backplane shaft 54 of each alignment pin 42 is received through the corresponding hole 56 of the backplane 26 as shown in FIG. 6. Each nut 60 is threaded onto the corresponding backplane shaft 54 to clamp the backplane 26 between the nut 60 and the flange 44 of the corresponding alignment pin 42 and thereby secure the alignment pins 42 to the backplane 26. The alignment pins 42, and thus the power connector 18, are thereby directly mounted to the backplane 26.

The alignment feature 62 of each alignment pin 42 cooperates with the backplane 26 to locate the power connector 18 relative to the signal connector 22 along the backplane 26. Specifically, and as shown in FIG. 6, the knurled segment 62a of each backplane shaft 54 engages the interior surface 64 of the corresponding hole 56 to self center the backplane shaft 54 within the corresponding hole 56. The self-centering of the backplane shaft 54 centers the corresponding alignment pin 42 relative to the corresponding hole 56 of the backplane 26. The holes 56 are positioned relative to the signal connectors 22 with a sufficiently tight tolerance such that the connectors 18 and 22 of the electronic system 12 can be simultaneously mated with the corresponding (fixed in position) connectors 16 and 20, respectively, of the power supply 14. Accordingly, by self-centering the backplane shaft 54 and thereby centering the alignment pins 42 relative to the corresponding holes 56, the alignment features 62 sufficiently locate the power connector 18 relative to the signal connector 22 along the backplane 26 to enable the electronic system 12 to be mated with the power supply 14. In addition or alternatively to the knurled segment 62a, any other method, structure, and/or the like may be used to self-center the alignment pins 42 relative to the corresponding holes 56. For example, an alignment pin 42 could include a threaded opening (not shown) on the side 48 of the flange 44 that receives a threaded fastener (not shown) through the corresponding hole 56 to center the alignment pin 42 relative to the corresponding hole 56.

Referring now to FIGS. 2, 5, and 6, the bus bar assembly 28 is mounted to the power connectors 18 to mount the bus bar assembly 28 to the backplane 26. The bus bar assembly 28 is configured to float relative to the power connectors 18 and the backplane 26 during mounting of the bus bar assembly 28 to the backplane 26. Specifically, the bus bar assembly 28 is mounted to the power connectors 18 by receiving the threaded shafts 50 of the alignment pins 42 of the power connectors 18 through the corresponding mounting openings 82 of the bus bar assembly 28. As best seen in FIG. 6, each mounting opening 82 is over-sized relative to the corresponding threaded shaft 50 such that the bus bar assembly 28 can float along the x-axis and the y-axis relative to the threaded shaft 50. Accordingly, the bus bar assembly 28 can float along the x and y axes relative to the power connectors 18 and the backplane 26 during mounting of the bus bar assembly 28 to the backplane 26 (i.e., before the bus bar assembly 28 is secured to the power connectors 18 by the power pins 40 as described below).

The floating of the bus bar assembly 28 relative to the backplane 26 and the power connectors 18 may mitigate tolerance differences between the backplane 26 and the bus bar assembly 28. For example, the floating of the bus bar assembly 28 relative to the backplane 26 and the power connectors 18 may enable the bus bar assembly 28 to be received on the threaded shafts 50 even when the tolerances of the bus bar assembly 28 (e.g., of the mounting openings 82) are larger than the tolerances of the backplane 26 (e.g., the locations of the signal connectors 22 and/or the locations of the holes 56). Moreover, and for example, the floating of the bus bar assembly 28 relative to the backplane 26 and the power connectors 18 may enable the bus bar assembly 28 to be mounted to the backplane 26 without damaging and/or being obstructed by the signal connectors 20 (not shown in FIG. 5) of the power supply 14 (not shown in FIG. 5). Further, and for example, the floating of the bus bar assembly 28 relative to the backplane 26 and the power connectors 18 may enable the bus bar assembly 28 to be mounted to the backplane 26 without interfering with mating of the signal connectors 20 of the power supply 14 with the signal connectors 22 of the electronic system 12. The mounting openings 82 may be over-sized relative to the threaded shafts 50 by any amount to enable the bus bar assembly 28 to float relative to the backplane 26 and the power connectors 18 by any amount.

After the bus bar assembly 28 has been assembled to the power connectors 18 as described above and shown in FIG. 5, the bus bar assembly 28 is secured to the power connectors 18, and thus the backplane 26, using the power pins 40. Specifically, the power pins 40 are threaded onto the corresponding threaded shafts 50 of the alignment pins 42 such that the corresponding layer 68 or 70 of the bus bar assembly 28 is clamped between the power pin 40 and the flange 44 of the corresponding alignment pin 42. As shown in FIG. 6, in the illustrated embodiment, the faces 72 and 76 of the layers 68 and 70, respectively, of the bus bar assembly 28 are engaged in electrical contact with the flange 44 of the corresponding alignment pin 42 at the corresponding areas 71 of the faces 72 and 76. Moreover, in the illustrated embodiment, the faces 74 and 78 of the layers 68 and 70, respectively, of the bus bar assembly 28 are engaged in electrical contact with the corresponding power pin 40 at the corresponding areas 71 of the faces 74 and 78. Accordingly, the bus bar assembly 28 is electrically connected to the power connectors 18.

As should be apparent from the Figures and description herein, the alignment pins 42 of the power connectors 18 are discrete components from the layers 68 and 70 of the bus bar assembly 28. Accordingly, the power connectors 18 are discrete components from the bus bar assembly 28 that are engaged in electrical contact with the bus bar assembly 28. In contrast, the power connectors of at least some known electronic systems that include bus bar assemblies are unitary structures of the bus bar assembly (e.g., blades that are bent outward from a body of the bus bar assembly or pins that are permanently welded or press-fit onto a body of the bus bar assembly in a fixed location). The discrete arrangement between the power connectors 18 and the bus bar assembly 28, as well as the sufficient locating described above provided by the alignment features 62 (not shown in FIG. 5), may mitigate tolerance differences between the backplane 26 and the bus bar assembly 28 that may otherwise prevent, or make it difficult to, mate the electronic system 12 with the power supply 14. Accordingly, the alignment features 62 and the discrete arrangement between the power connectors 18 and the bus bar assembly 28 enable the electronic system 12 to be mated with the power supply 14 even when tolerance differences exist between the backplane 26 and the bus bar assembly 28.

Figure 7:
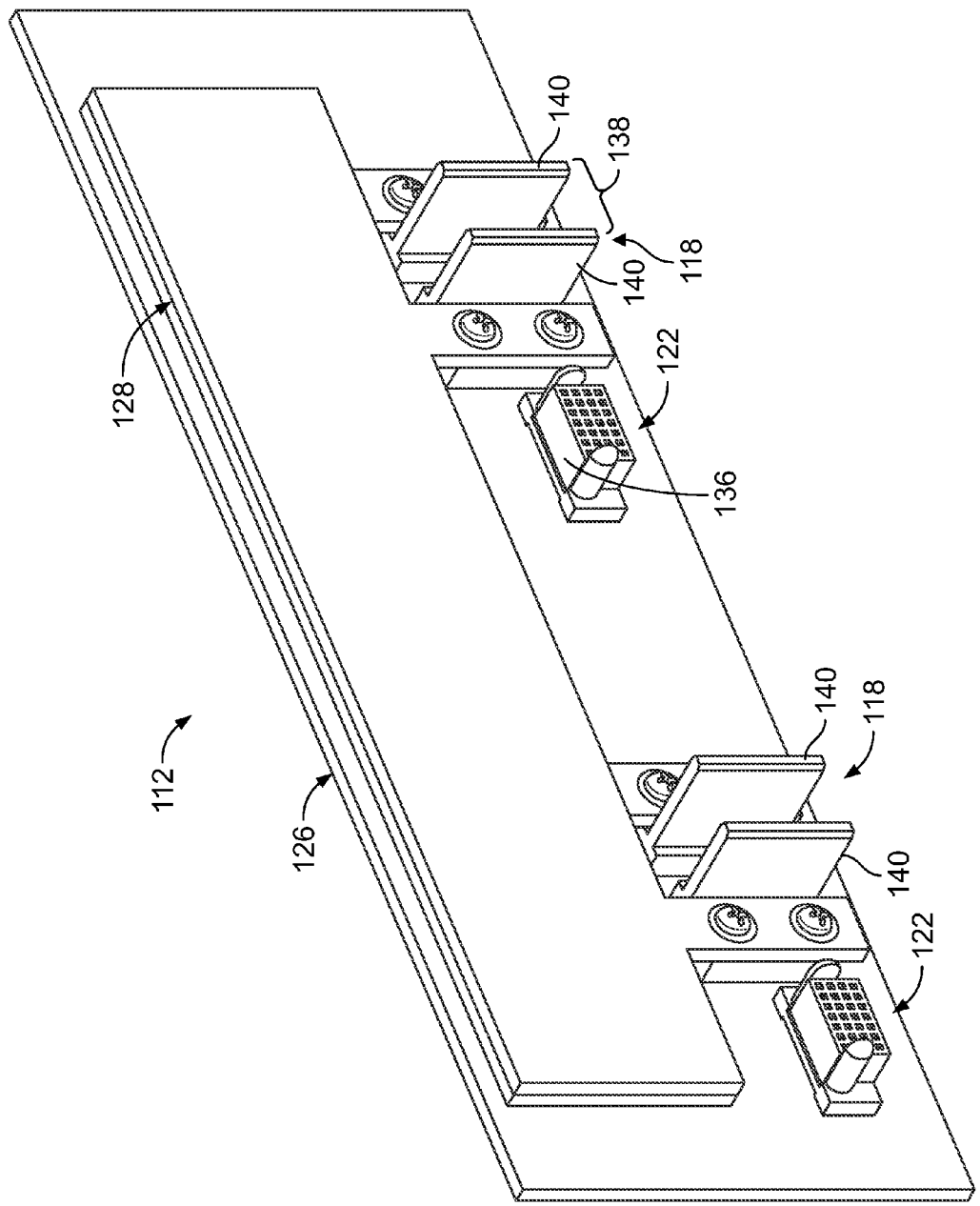
FIG. 7 is a perspective view of another embodiment of an electronic system.

FIG. 7 is a perspective view of another embodiment of an electronic system 112. The electronic system 112 is configured to be mated with an electrical power supply (not shown) to supply the electronic system 112 with electrical power to drive operation of the electronic system 112. The electronic system 112 includes one or more power connectors 118 that are configured to mate with corresponding power connectors (not shown; optionally fixed in position) of the power supply for supplying the electronic system 112 with electrical power. The illustrated embodiment of the electronic system 112 also includes one or more signal connectors 122 that are configured to mate with corresponding signal connectors (not shown; optionally fixed in position) of the power supply for transmitting signals between the electronic system 112 and another component. The electronic system 112 also includes a backplane 126 and a power bus bar assembly 128. Each power connector of the power supply may be referred to herein as a "mating power connector". Each signal connector of the power supply may be referred to herein as a "mating auxiliary connector".

In the illustrated embodiment, the signal connectors 122 are plug connectors that include plugs 136 that are received by the corresponding signal connectors of the power supply. But, each signal connector 122 additionally or alternatively may include any other structure (i.e., each signal connector 122 may be any type of connector). In the illustrated embodiment of the power connectors 118, a mating interface 138 of each power connector 118 is defined by power blades 140 that mate with the corresponding power connector of the power supply for transferring electrical power from the power supply to the electronic system 112. But, the mating interface 138 of each power connector 118 additionally or alternatively may include any other structure. Although two are shown, each power connector 118 may include any number of electrical connections with the corresponding power connector of the power supply. The electronic system 112 may include any number of the power connectors 118 and any number of the signal connectors 122. The illustrated embodiment of the electronic system 112 includes two power connectors 118 and two signal connectors 122. In some embodiments, one or more of the signal connectors 122 and the corresponding signal connector of the power supply 114 may supply electrical power to the electronic system 112 (e.g., an electrical power input to the power supply 114) in addition to the signal connection provided by the signal connector 122 and the corresponding signal connector of the power supply 114. Moreover, in some embodiments, the electronic system 112 does not include any signal connectors 122 and/or the electronic system 112 includes one or more power connectors (not shown; each of which may be referred to herein as an "auxiliary connector") that mate with corresponding power connectors (not shown; each of which may be referred to herein as a "mating auxiliary connector") of the power supply 114 to provide an electrical power input to the power supply 114 (i.e., supply electrical power to the power supply 114). Each signal connector 122 may be referred to herein as an "auxiliary connector".

The bus bar assembly 128 is mounted to the backplane 126 such that the bus bar assembly 128 is engaged in electrical contact with the power connectors 118, as will be described below. The bus bar assembly 128 and the power connectors 118 thus are electrically connected to each other. The bus bar assembly 128 may facilitate handling a larger current load supplied to the electronic system 112 from the power supply as compared to systems that do not include a bus bar assembly 128. In the illustrated embodiment, the bus bar assembly 128 is mounted to the power connectors 118 such that the bus bar assembly 128 is indirectly mounted to the backplane 126 (i.e., the bus bar assembly 128 is mounted to the backplane 126 via the power connectors 118), as will be described below.

Figure 8:
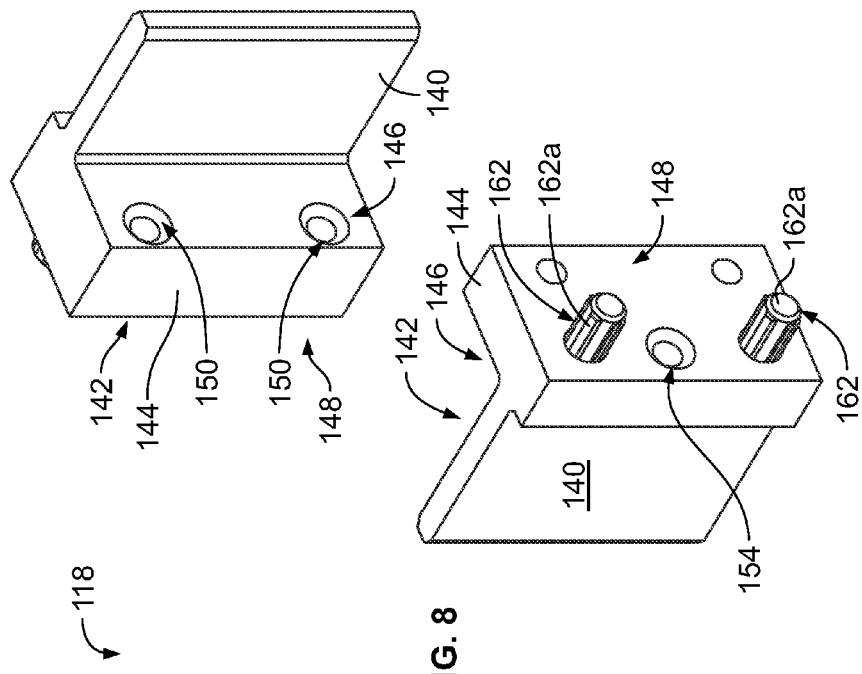
FIG. 8 is a front perspective view of an embodiment of a power connector of the electronic system shown in FIG. 7.
Figure 9:
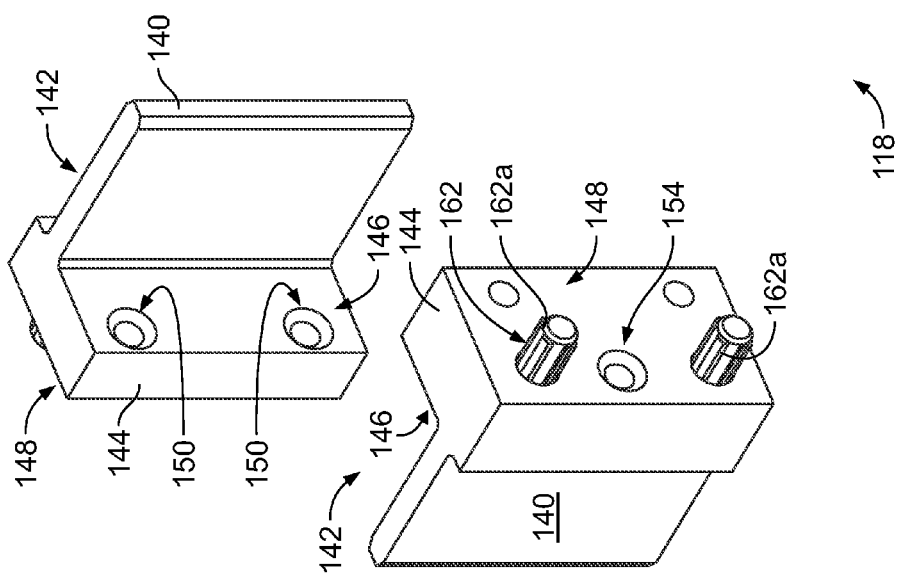
FIG. 9 is a rear perspective view of the power connector shown in FIG. 8.

FIG. 8 is a front perspective view of an embodiment of a power connector 118 of the electronic system 112. FIG. 9 is a rear perspective view of the power connector 118. Referring now to FIGS. 8 and 9, the illustrated embodiment of the power connector 118 includes two power contacts 142. Each power contact 142 includes a base 144 and a power blade 140. The base 144 includes opposite sides 146 and 148. The power blade 140 extends outward from the side 146 of the base 144. As shown in FIG. 8, the side 146 of the base 144 includes one or more threaded openings 150 for mounting the bus bar assembly 128 (shown in FIGS. 7, 10, and 12) to the power connector 118 using threaded fasteners 152 (shown in FIG. 10), as will be described below.

Each power contact 142, and thus the power connector 118, is directly mounted to the backplane 126 (shown in FIGS. 7, and 10-12). For example, as shown in FIG. 9, the side 148 of the base 144 includes an optional threaded opening 154 for securing the power contact 142 to the backplane 126 using threaded fasteners 166 (shown in FIGS. 11 and 12), as will be described below. Any other type of structure, fastener, and/or the like may be used in addition or alternatively to the openings 154 and fasteners 166 to mount the power contacts 142 to the backplane 126.

Each power contact 142 of the power connector 18 includes one or more alignment features 162 that cooperate with the backplane 126 to locate the power connector 118 relative to the signal connectors 122 (shown in FIGS. 7 and 10-12) along the backplane 126. In the illustrated embodiment of the power contacts 142, the alignment features 162 are press-fit pins 162a that are configured to be press-fit into a corresponding hole 156 (shown in FIGS. 11 and 12) of the backplane 126. The press-fit pins 162a are configured to self-center within the corresponding hole 156 to locate the power contact 142, and thus the power connector 118, relative to the signal connectors 122 along the backplane 126. In other embodiments, another type of alignment feature (such as, but not limited to, a knurled member and/or the like) may be used in addition or alternative to the press-fit pins 162a. Optionally, the press-fit pins 162a are used without the threaded openings 154 and the threaded fasteners 166 to secure the power contacts 142 to the backplane 126. Each hole 156 may be referred to herein as a "backplane hole". Although two are shown, each power contact 142 may include any number of the alignment features 162.

Figure 10:
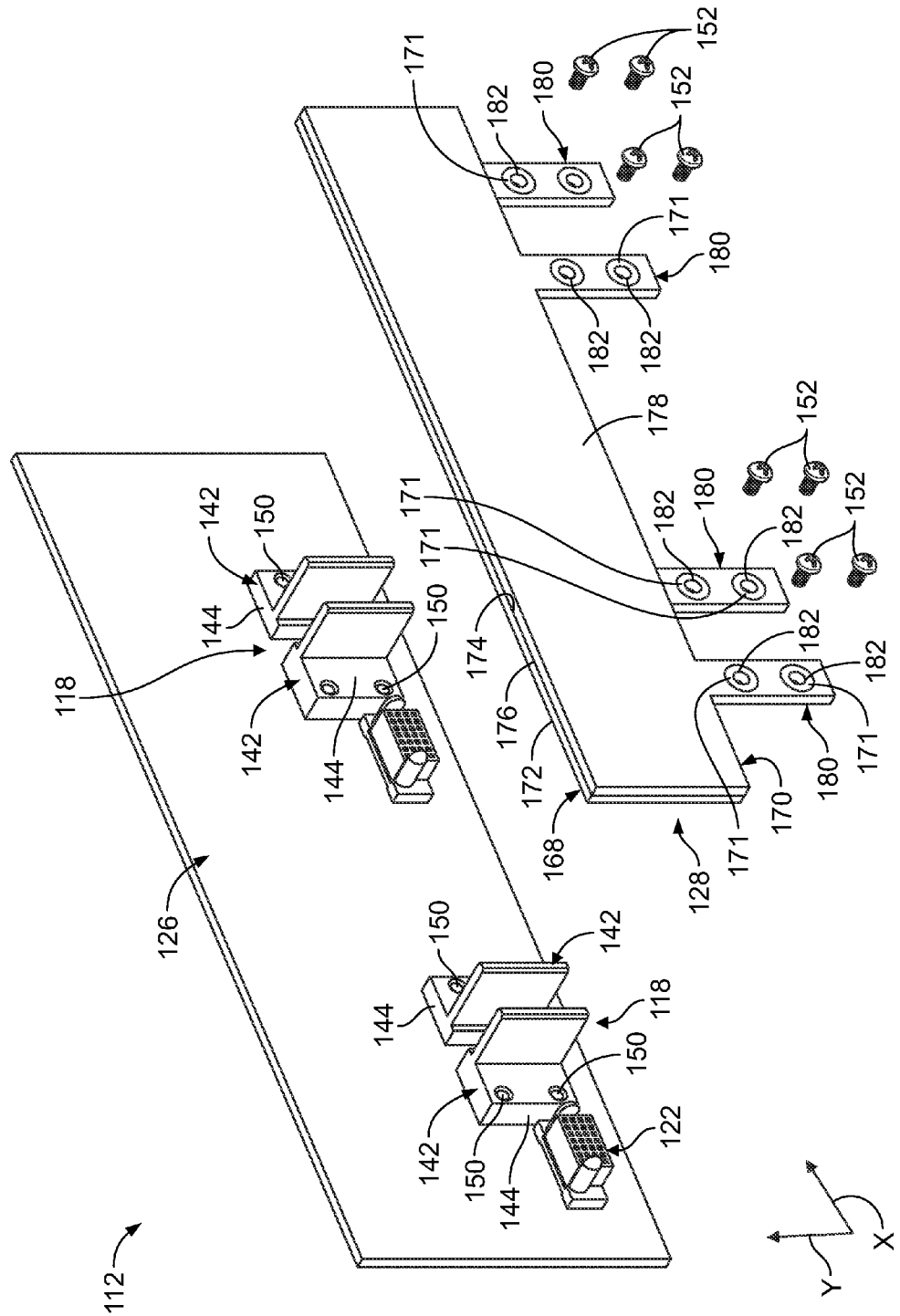
FIG. 10 is a partially exploded perspective view of the electronic system shown in FIG. 7.

FIG. 10 is a partially exploded perspective view of the electronic system 112 illustrating the bus bar assembly 128 exploded from the backplane 126. In the illustrated embodiment, the bus bar assembly 128 includes two layers, namely an inner layer 168 and an outer layer 170. Each layer 168 and 170 is electrically conductive. The inner layer 168 includes opposite faces 172 and 174, and the outer layer 170 includes opposite faces 176 and 178. In the illustrated embodiment, the layers 168 and 170 are stacked against each other such that the faces 174 and 176 are engaged in physical contact with each other, with the face 172 of the inner layer 168 facing toward the backplane 126 and the face 178 of the outer layer 170 facing away from the backplane 126. Portions of the layers 168 and/or 170 (e.g., the face 172, the face 174, the face 176, the face 178, edge portion(s), and/or the like) may be covered (e.g., coated) with an electrically insulating material to electrically isolate the layers 168 and 170 from each other and/or to facilitate preventing electrical shorting and/or electrical shock. For example, in the illustrated embodiment, an approximate entirety (excepting the areas 171 described below) of each of the layers 168 and 170 is covered with an electrically insulating material. As shown in FIG. 10, the areas 171 surrounding the mounting openings 182 described below are left uncovered on the faces 172 and/or 174 of the layer 168 and on the faces 176 and/or 178 of the layer 170 to enable the layers 168 and 170 to make electrical contact with the corresponding power contact 142 and/or one or more of the corresponding threaded fasteners 152. Although the illustrated embodiment of the bus bar assembly 128 includes two layers 168 and 170, the bus bar assembly 128 may include any number of layers. In some embodiments, the bus bar assembly 128 includes only a single layer. The bus bar assembly 128 may be referred to herein as a "power bus bar" regardless of the number of layers.

In the illustrated embodiment, each layer 168 and 170 includes a mounting flange 180 that is configured to mount the bus bar assembly 128 on a corresponding power contact 142 of a corresponding power connector 118. Each mounting flange 180 includes one or more mounting openings 182 configured to receive the corresponding threaded fastener 152 therethrough to mount the bus bar assembly 128 to the power connectors 118, and thus to the backplane 126. Each mounting opening 182 is over-sized relative to the corresponding threaded fastener 152 to enable the bus bar assembly 128 to float relative to the power contact 142 and the backplane 126 during mounting of the bus bar assembly 128 to the backplane 126, as will be described below.

Although each layer 168 and 170 includes a mounting flange 180 and mounting openings 182 for mounting to a different power contact 142 of the same power connector 118, in other embodiments one or more of the layers 168 and/or 170 includes mounting flanges 180 and mounting openings 182 for mounting to both power contacts 142 of the same power connector 118.

Figure 11:
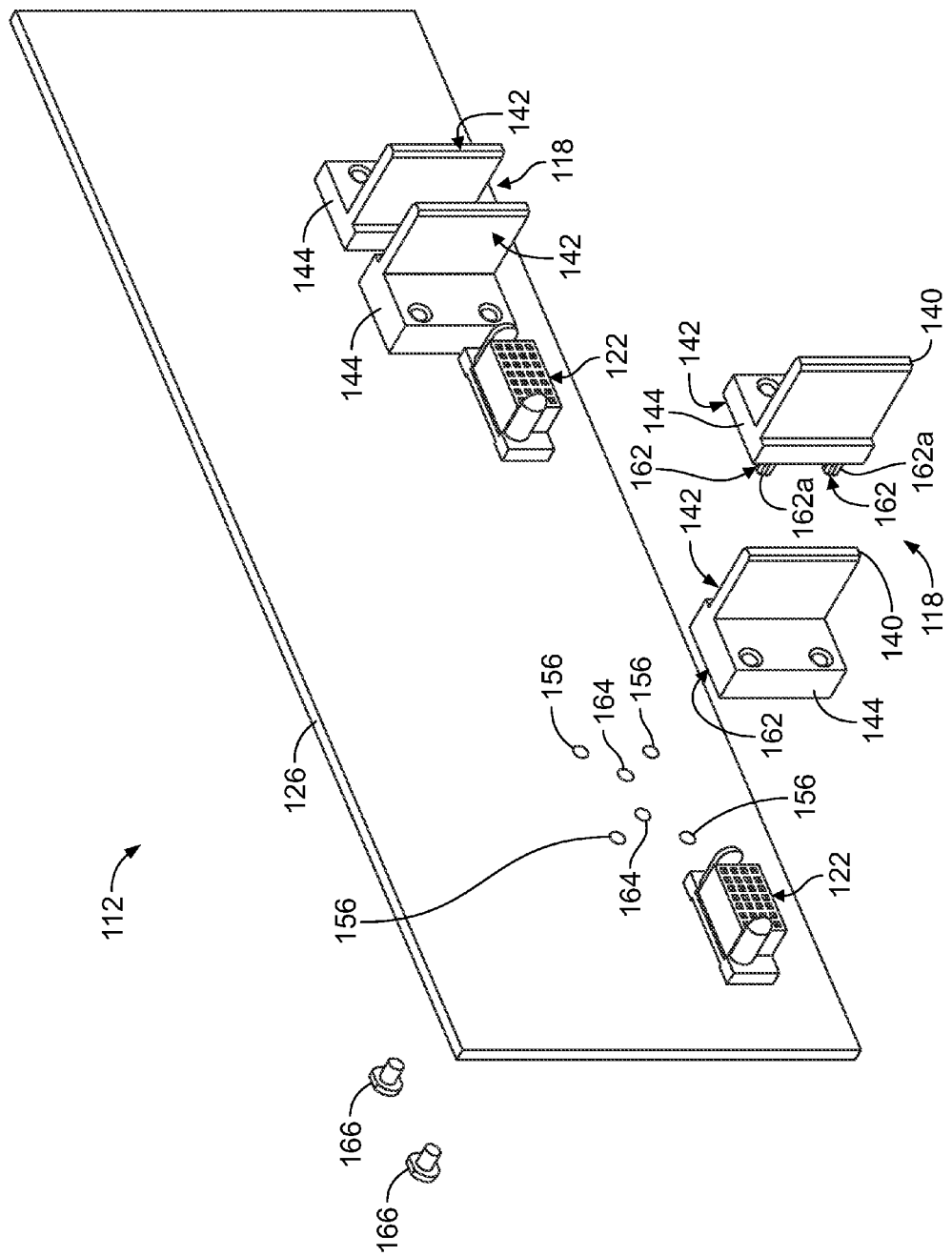
FIG. 11 is a partially exploded perspective view of a portion of the electronic system shown in FIGS. 7 and 10.
Figure 12:
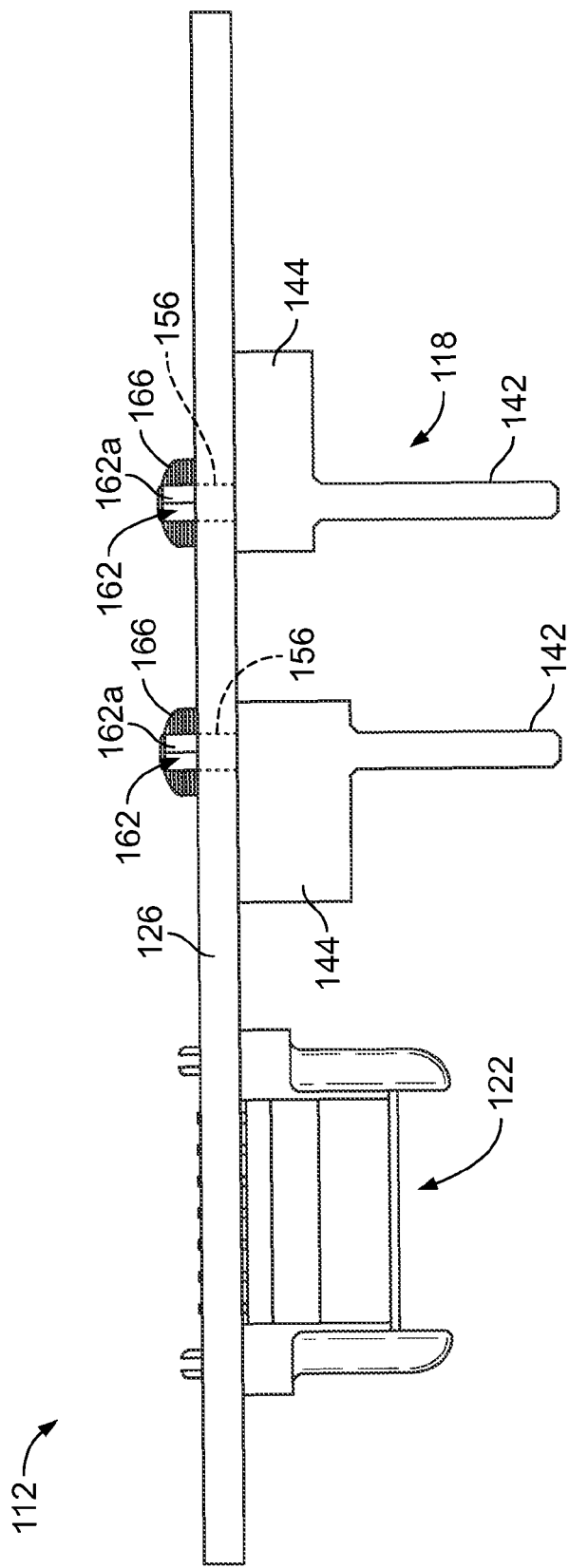
FIG. 12 is a top plan view of a portion of the electronic system shown in FIGS. 7, 10, and 11.

FIG. 11 is a partially exploded perspective view of a portion of the electronic system 112. FIG. 12 is a top plan view of a portion of the electronic system 112. Referring now to FIGS. 11 and 12, the power contacts 142 of the power connectors 118 are shown as directly mounted to the backplane 126. Specifically, the threaded fasteners 166 are threadably connected to the corresponding threaded openings 154 (shown in FIG. 9) of the power contacts 142 through corresponding openings 164 (not visible in FIG. 12) of the backplane 126 to clamp the backplane 126 between the threaded fasteners 166 and the bases 144 of the power contacts 142 and thereby secure the power contacts 142 to the backplane 126. The power contacts 142, and thus the power connectors 118, are thereby directly mounted to the backplane 126.

The alignment feature 162 of each power contact 142 cooperates with the backplane 126 to locate the power connectors 118 relative to the signal connectors 122 along the backplane 126. Specifically, the press-fit pins 162a are press-fit within the corresponding holes 156 such that the press-fit pins 162a are self-centered within the corresponding hole 156. The self-centering of the press-fit pins 162a locates the power contacts 142, and thus the power connectors 18, relative to the signal connectors 122 along the backplane 126. The holes 156 are positioned relative to the signal connectors 122 with a sufficiently tight tolerance such that the connectors 118 and 122 of the electronic system 12 can be simultaneously mated with the corresponding (fixed in position) connectors of the power supply. Accordingly, by self-centering the press-fit pins 162a, the alignment features 162 sufficiently locate the power connectors 118 relative to the signal connectors 122 along the backplane 126 to enable the electronic system 112 to be mated with the power supply.

Referring again to FIG. 10, the bus bar assembly 128 is mounted to the power connectors 118 to mount the bus bar assembly 128 to the backplane 126. The bus bar assembly 128 is configured to float relative to the power connectors 118 and the backplane 126 during mounting of the bus bar assembly 128 to the backplane 126. Specifically, the bus bar assembly 128 is mounted to the power connectors 118 by receiving the threaded fasteners 152 through the corresponding mounting openings 182 of the bus bar assembly 128 and loosely threading the threaded fasteners into the corresponding threaded openings 150 of the power contacts 142. Each mounting opening 182 is over-sized relative to the corresponding threaded fastener 152 such that the bus bar assembly 128 can float along the x-axis and the y-axis relative to the threaded fastener 152. Accordingly, the bus bar assembly 128 can float along the x and y axes relative to the power connectors 118 and the backplane 126 during mounting of the bus bar assembly 128 to the backplane 126 (i.e., before the bus bar assembly 128 is fully secured to the power connectors 118 with the threaded fasteners 152 as described below).

The floating of the bus bar assembly 128 relative to the backplane 126 and the power connectors 118 may mitigate tolerance differences between the backplane 126 and the bus bar assembly 128. For example, the floating of the bus bar assembly 128 relative to the backplane 126 and the power connectors 118 may enable the bus bar assembly 128 to be mounted to power contacts 142 even when the tolerances of the bus bar assembly 128 (e.g., of the mounting openings 182) are larger than the tolerances of the backplane 126 (e.g., the locations of the signal connectors 122 and/or the locations of the holes 156). Moreover, and for example, the floating of the bus bar assembly 128 relative to the backplane 126 and the power connectors 118 may enable the bus bar assembly 128 to be mounted to the backplane 126 without damaging and/or being obstructed by the signal connectors of the power supply. Further, and for example, the floating of the bus bar assembly 128 relative to the backplane 126 and the power connectors 118 may enable the bus bar assembly 128 to be mounted to the backplane 126 without interfering with mating of the signal connectors of the power supply with the signal connectors 122 of the electronic system 112. The mounting openings 182 may be over-sized relative to the threaded fasteners 152 by any amount to enable the bus bar assembly 128 to float relative to the backplane 126 and power connectors 118 by any amount.

After the bus bar assembly 128 has been assembled to the power connectors 118 with the fasteners 152 loose as described above, the bus bar assembly 128 is secured to the power connectors 118, and thus the backplane 126, by fully tightening the threaded fasteners 152 within the corresponding threaded openings 150 of the power contacts 142. The corresponding layer 168 or 170 of the bus bar assembly 128 is thereby clamped between the threaded fasteners 152 and the base 144 of the corresponding power contact 142. In the illustrated embodiment, the faces 172 and 176 of the layers 168 and 170, respectively, of the bus bar assembly 128 are engaged in electrical contact with the base 144 of the corresponding power contact 142 at the corresponding areas 171 (not visible herein) of the faces 172 and 176. Moreover, in the illustrated embodiment, the faces 174 and 178 of the layers 168 and 170, respectively, of the bus bar assembly 128 are engaged in electrical contact with the corresponding threaded fasteners 152 at the corresponding areas 171 of the faces 174 and 178. Accordingly, the bus bar assembly 128 is electrically connected to the power connectors 118.

As should be apparent from the Figures and description herein, the power contacts 142 of the power connectors 118 are discrete components from the layers 168 and 170 of the bus bar assembly 128. Accordingly, the power connectors 118 are discrete components from the bus bar assembly 128 that are engaged in electrical contact with the bus bar assembly 128. In contrast, the power connectors of at least some known electronic systems that include bus bar assemblies are unitary structures of the bus bar assembly (e.g., blades that are bent outward from a body of the bus bar assembly). The discrete arrangement between the power connectors 118 and the bus bar assembly 128, as well as the sufficient locating described above provided by the alignment features 162 (not shown in FIG. 10), may mitigate tolerance differences between the backplane 126 and the bus bar assembly 128 that may otherwise prevent, or make it difficult to, mate the electronic system 112 with the power supply. Accordingly, the alignment features 162 and the discrete arrangement between the power connectors 118 and the bus bar assembly 128 enable the electronic system 112 to be mated with the power supply even when tolerance differences exist between the backplane 126 and the bus bar assembly 128.

The embodiments described and/or illustrated herein may provide an electronic system that can mate with a power supply even when tolerance differences exist between a backplane and a power bus bar of the electronic system. The embodiments described and/or illustrated herein may provide an electrical system and/or a power supply that is smaller, less complex, and/or less costly as compared to at least some known electronic systems and/or power supplies.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A system comprising:
   a backplane;
   an auxiliary connector mounted to the backplane, the auxiliary connector being configured to mate with a corresponding mating auxiliary connector of an electrical power supply;
   a power connector mounted directly to the backplane, the power connector being configured to mate with a corresponding mating power connector of the electrical power supply; and
   a power bus bar mounted indirectly to the backplane, the power bus bar being engaged in electrical contact with the power connector, wherein the power bus bar is positioned between the backplane and the power connector.

2. The system of claim 1, wherein the power connector comprises an alignment feature that cooperates with the backplane to locate the power connector relative to the auxiliary connector along the backplane.

3. The system of claim 1, wherein the power connector comprises an alignment pin having a backplane shaft received within a hole of the backplane, the backplane shaft comprising an alignment feature configured to self-center the backplane shaft relative to the hole of the backplane.

4. The system of claim 1, wherein the power connector comprises an alignment pin having a backplane shaft received within a hole of the backplane, the backplane shaft comprising a knurled segment configured to self-center the backplane shaft relative to the hole of the backplane.

5. The system of claim 1, wherein the power connector comprises a press-fit pin that is press-fit within a hole of the backplane, the press-fit pin being configured to self center within the hole of the backplane to locate the power connector relative to the auxiliary connector along the backplane.

6. The system of claim 1, wherein the power bus bar is configured to float relative to the backplane during mounting of the power bus bar to the backplane.

7. The system of claim 1, wherein the power bus bar is mounted to the power connector to indirectly mount the power bus bar to the backplane.

8. The system of claim 1, wherein the power bus bar is mounted to the power connector to indirectly mount the power bus bar to the backplane, the power bus bar being configured to be mounted to the power connector such that the power bus bar is configured to float relative to the power connector and the backplane during mounting of the power bus bar to the backplane.

9. The system of claim 1, wherein the power connector comprises a power pin configured to mate with the mating power connector of the electrical power supply.

10. The system of claim 1, wherein the power connector comprises a blade configured to mate with the mating power connector of the electrical power supply.

11. A system comprising:
    a backplane;
    an auxiliary connector mounted to the backplane, the auxiliary connector being configured to mate with a corresponding mating auxiliary connector of an electrical power supply;
    a power bus bar mounted to the backplane, wherein the power bus bar is mounted indirectly to the backplane; and
    a power connector mounted to the backplane, the power connector being configured to mate with a corresponding mating power connector of the electrical power supply, wherein the power connector is a discrete component from the power bus bar that is engaged in electrical contact with the power bus bar, the power bus bar is positioned between the backplane and the power connector.

12. The system of claim 11, wherein the power connector comprises an alignment feature that cooperates with the backplane to locate the power connector relative to the auxiliary connector along the backplane.

13. The system of claim 11, wherein the power connector comprises one of:
    an alignment pin having a backplane shaft comprising a knurled segment configured to self center the alignment pin relative to a backplane hole within which the backplane shaft is received; or
    a press-fit pin configured to self-center within a backplane hole within which the press-fit pin is received to locate the power connector relative to the auxiliary connector along the backplane.

14. The system of claim 11, wherein the power bus bar is mounted to the power connector to indirectly mount the power bus bar to the backplane, the power bus bar being configured to be mounted to the power connector such that the power bus bar is configured to float relative to the power connector and the backplane during mounting of the power bus bar to the backplane.

15. The system of claim 11, wherein the power bus bar is mounted to the power connector to indirectly mount the power bus bar to the backplane.

16. A system comprising:
    a backplane;
    an auxiliary connector mounted to the backplane, the auxiliary connector being configured to mate with a corresponding mating auxiliary connector of an electrical power supply;
    a power connector mounted to the backplane, the power connector being configured to mate with a corresponding mating power connector of the electrical power supply; and
    a power bus bar mounted to the backplane positioned between the backplane and the power connector, the power bus bar being engaged in electrical contact with the power connector, wherein the power bus bar is configured to float along at least one axis relative to the backplane during mounting of the power bus bar to the backplane.

17. The system of claim 16, wherein the power bus bar comprises a mounting opening configured to receive a threaded shaft therethrough for mounting the power bus bar to the backplane, the mounting opening of the power bus bar being over-sized relative to the threaded shaft to enable the power bus bar to float relative to the backplane and the threaded shaft during mounting of the power bus bar to the backplane.

18. The system of claim 16, wherein the power bus bar is mounted to the power connector to indirectly mount the power bus bar to the backplane, the power bus bar being configured to be mounted to the power connector such that the power bus bar is configured to float relative to the power connector and the backplane during mounting of the power bus bar to the power connector.

19. The system of claim 16, wherein the power connector comprises an alignment pin and a power pin, the alignment pin comprising a threaded shaft, the power bus bar comprising a mounting opening that receives the threaded shaft therethrough, the power pin being threadably connected to the threaded shaft such that the power bus bar is clamped between the power pin and the alignment pin to mount the power bus bar to the backplane, wherein the mounting opening of the power bus bar is over-sized relative to the threaded shaft to enable the power bus bar to float relative to the backplane and the alignment pin during mounting of the power bus bar to the backplane.

20. The system of claim 16, wherein the power connector comprises a threaded opening, the power bus bar comprising a mounting opening that receives a threaded fastener that threadably engages the threaded opening of the power connector to mount the power bus bar to the backplane, wherein the mounting opening of the power bus bar is over-sized relative to the threaded fastener to enable the power bus bar to float relative to the backplane and the power connector during mounting of the power bus bar to the backplane.

* * * * *